(12) United States Patent
Houze

(10) Patent No.: US 6,371,737 B1
(45) Date of Patent: Apr. 16, 2002

(54) CONVEYING PUMPED GASES IN A VACUUM PUMP OR IN PIPES

(75) Inventor: François Houze, Cuvat (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/431,212

(22) Filed: Nov. 1, 1999

(30) Foreign Application Priority Data

Nov. 2, 1998 (FR) .............................................. 98 13727

(51) Int. Cl.$^7$ .......................... F04B 23/00; C23L 16/00
(52) U.S. Cl. ....................................... 417/313; 118/715
(58) Field of Search ........................ 417/313; 438/680, 438/683; 427/555; 118/715; 373/126; 219/121.11; 220/592.27

(56) References Cited

U.S. PATENT DOCUMENTS

| | | | |
|---|---|---|---|
| 3,846,574 A | | 11/1974 | Rordorf |
| 4,207,834 A | * | 6/1980 | Canteloup et al. .......... 118/620 |
| 4,394,554 A | * | 7/1983 | Warabi et al. ............... 218/134 |
| 4,548,257 A | * | 10/1985 | Williamson ................. 165/142 |
| 4,565,157 A | * | 1/1986 | Brors et al. ................. 118/719 |
| 4,940,398 A | * | 7/1990 | Berges et al. ............ 417/410.4 |
| 5,063,651 A | * | 11/1991 | Kneip, Jr. et al. ......... 29/455.1 |
| 5,556,473 A | * | 9/1996 | Olson et al. ................. 118/719 |
| 5,655,681 A | * | 8/1997 | Vogel et al. ................. 220/422 |
| 5,674,574 A | * | 10/1997 | Atwell et al. ............... 427/561 |
| 5,817,575 A | | 10/1998 | Han |
| 6,068,784 A | * | 5/2000 | Collins et al. ................. 216/68 |

FOREIGN PATENT DOCUMENTS

| | | |
|---|---|---|
| DE | 30 03 798 A1 | 8/1981 |
| EP | 0 358 005 A1 | 3/1990 |
| GB | 2 040 011 A | 8/1980 |

OTHER PUBLICATIONS

Patent Abstracts of Japan, vol. 95, No. 4, May 31, 1995 corresponding to JP 07 012291 A (Matsushita Electric Ind Co Ltd) Jan. 17, 1995.

* cited by examiner

Primary Examiner—Teresa Walberg
Assistant Examiner—Daniel Robinson
(74) Attorney, Agent, or Firm—Sughrue Mion, PLLC

(57) ABSTRACT

A vacuum-generating device including at least one vacuum pump associated with a suction pipe and with a delivery pipe, at least a portion of the vacuum-generating device is separated from the ambient atmosphere by a volume in which a suitable vacuum prevails. The solution is applicable in particular to delivery pipes of primary pumps, and it makes it possible to prevent the pumped gases from condensing and solidifying, while also reducing the noise given off.

12 Claims, 1 Drawing Sheet

CONVEYING PUMPED GASES IN A VACUUM PUMP OR IN PIPES

The present invention relates to vacuum-generating devices comprising at least one vacuum pump associated with a suction pipe and with a delivery pipe.

BACKGROUND OF THE INVENTION

One of the frequent uses of a vacuum pump is to generate a vacuum in an enclosure for treating semiconductors.

During such treatment, materials are deposited on a semiconductor wafer. The efficiency of the deposition is relatively low, and the vacuum pump sucks up a large portion of the materials for deposition on the semiconductor. When the vacuum pump delivers at atmospheric pressure or at relatively high pressures, the pumped gases tend to condense and to solidify when their temperature is too low, which can degrade the effectiveness of the pump.

That phenomenon takes place essentially at the outlets of the primary pumps, where the pressure is high and where the gases cool rapidly as they leave the body of the pump.

That problem also occurs in the suction pipes, upstream from the pump, but to a lesser extent.

To limit such unwanted deposition, current solutions consist essentially in heating the pipes so as to prevent cold spots, which are the preferred places at which the gases condense and solidify.

Those solutions require additional energy to be supplied, and their effectiveness varies as a function of the gases being pumped and of the vacuum conditions.

OBJECTS AND SUMMARY OF THE INVENTION

The problem that the present invention proposes to address is to design new means making it possible for pumped gases to be prevented effectively from condensing and solidifying in the high-pressure zones of vacuum pumps, without requiring an additional external supply of energy to heat the pipes.

Another object of the invention is to design such means that make it possible simultaneously to reduce the noise given off by the vacuum-generating device, by preventing soundwaves from propagating.

The invention results from the observation that merely by insulating a vacuum pump pipe highly effectively by means of a vacuum layer interposed between the pipe and the ambient atmosphere, it is possible to maintain the pipe at a suitable temperature, thereby avoiding any risk of the pumped gases condensing or solidifying. In addition, the vacuum layer simultaneously provides effective sound insulation that blocks the outward propagation of soundwaves.

Thus, to achieve these objects and others, a vacuum-generating device of the invention comprises at least one vacuum pump associated with a suction pipe and with a delivery pipe, at least a portion of the vacuum-generating device being separated from the outside atmosphere by a volume in which a suitable vacuum prevails.

In a first embodiment, said volume in which a suitable vacuum prevails is gastight, thereby maintaining said suitable vacuum permanently.

In another embodiment, said volume in which a suitable vacuum prevails is connected to an external vacuum source which sustains said suitable vacuum.

In which case, advantageously, it is possible to make use of the fact that the invention is applied to a vacuum-generating device: the vacuum-generating device itself is then used as the external vacuum source.

In practice, to create said volume in which a suitable vacuum prevails, it is possible to provide a gastight double wall made up of two walls separated from each other, and said volume occupies the space between the two walls of the gastight double wall.

Alternatively, it is possible to provide a single wall around the vacuum-generating device; in which case, said volume in which a suitable vacuum prevails occupies the space between the gastight outer wall and a portion of the vacuum-generating device.

In a first application, said volume in which a suitable vacuum prevails is formed around the delivery pipe of a primary vacuum pump, so as to prevent the pumped gases from condensing and solidifying, and so as to reduce the noise given off.

In another application, said volume in which a suitable vacuum prevails surrounds internal devices for acoustically damping pulsating pressure and soundwaves (silencers, sound traps, etc.)

In another application, said volume in which a suitable vacuum prevails is formed around an intermediate or suction pipe element in the vacuum-generating device. It is thus possible to prevent the pumped gases from condensing and solidifying in the zones in which there is a risk of that occurring.

In another application, said volume in which a suitable vacuum prevails surrounds the vacuum pump itself. This use makes it possible to limit the noise given off by the pump.

BRIEF DESCRIPTION OF THE DRAWINGS

Other objects characteristics, and advantages of the present invention appear from the following description of particular embodiments given with reference to the accompanying figures, in which.

MORE DETAILED DESCRIPTION

Figure 1:
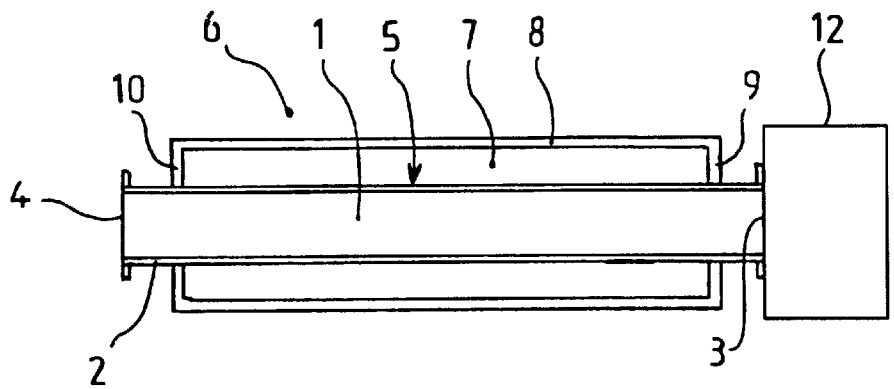
FIG. 1 shows a first application of the invention, as adapted to a pipe for conveying pumped gases by means of a vacuum pump.

In the embodiment shown in FIG. 1, a portion of pipe 1 is formed by a cylindrical tube 2 open at both ends 3 and 4, and whose side surface 5 is insulated from the outside atmosphere 6 by a volume 7 in which a suitable vacuum prevails. In this case, the volume 7 occupies the space between a gastight outer wall 8 and the tube 2. The gastight outer wall 8 is a cylindrical tubular segment of diameter greater than the diameter of the tube 2. It is disposed coaxially along the tube 2, and it has two end plates 9 and 10 which connect it in gastight manner to the side wall of the tube 2 in the vicinity of its ends 3 and 4.

By providing sufficient gastightness around the volume 7 by means of the gastight outer volume 8 and by means of it being connected in gastight manner to the peripheral wall of the tube 2, it is possible to generate a suitable vacuum in the volume 7 and this vacuum is maintained permanently.

Alternatively, the volume 7 may advantageously be connected to an external vacuum source which sustains the suitable vacuum. This external vacuum source may advantageously be the vacuum pump itself which is associated with the pipe 1.

Figure 2:
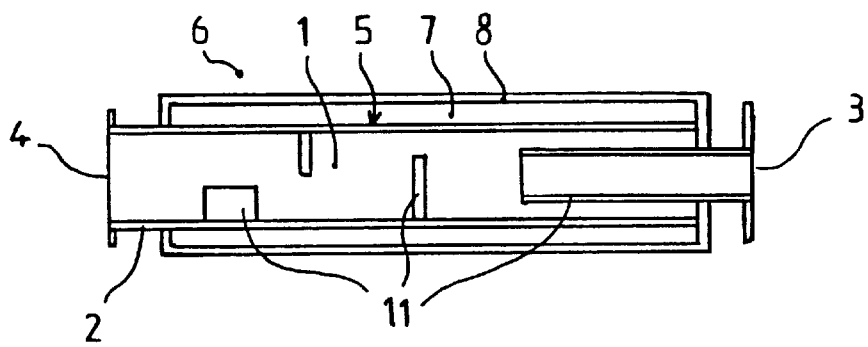
FIG. 2 shows a second application of the invention to a pipe for delivering pumped gases by means of a vacuum pump provided with internal damper devices for acoustically damping pulsating pressure.

The embodiment shown in FIG. 2 involves the same elements as the embodiment shown in FIG. 1, namely the pipe formed by a tube 2 between two open ends 3 and 4, with a gastight outer wall 8 surrounding the side surface 5 so as to delimit a volume 7 in which a suitable vacuum prevails.

In this case, the pipe 1 is a delivery pipe at the outlet of a vacuum pump, and it contains internal damper devices 11 for acoustically damping pulsating pressure.

In the embodiments shown in FIGS. 1 and 2, the gastight outer wall 8 is a single wall, and the volume 7 in which a suitable vacuum prevails is situated between the gastight outer wall 8 and that portion of the vacuum-generating device which is constituted by the tube 2 of the pipe 1.

Alternatively, it is possible to surround the side surface 5 of the tube 2 with a gastight double wall, the space situated between the two walls of the gastight double wall being occupied by the volume in which a suitable vacuum prevails.

Figure 3:
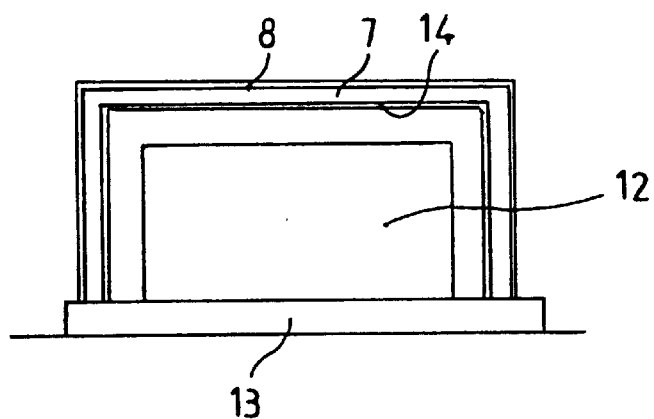
FIG. 3 shows a third application of the invention to insulating a vacuum pump.

The embodiment shown in FIG. 3 illustrates an application of the invention to a vacuum pump 12. The vacuum pump 12 stands on a base 13 and is covered with a double-walled hood made up of a gastight outer wall 8 and of a gastight inner wall 14 separated from the gastight outer wall 8 so as to define a volume 7 in which a suitable vacuum prevails. The risks of gases condensing and solidifying in the intermediate stages of the vacuum pump 12 are thus reduced, and the noise given off by the vacuum pump 12 is simultaneously reduced.

Figure 4:
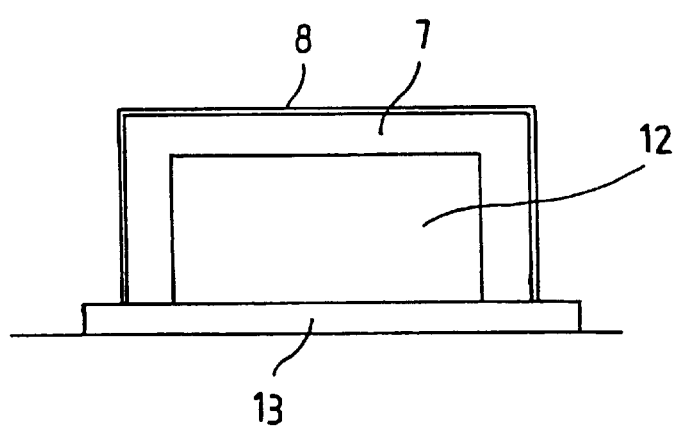
FIG. 4 shows a variant of the invention for insulating a vacuum pump.

In the embodiment shown in FIG. 4, the vacuum pump 12 stands on a base 13 and is covered with a gastight outer wall 8 separated from the vacuum pump 12 by a space defining a gastight volume 7 in which a suitable vacuum prevails. The advantages are the same as those obtained with the embodiment shown in FIG. 3.

In both embodiments, it is possible to impart sufficient gastightness to the gastight outer wall 8 for the vacuum established in the volume 7 to be maintained permanently.

Alternatively, the volume 7 is connected to an external vacuum source which sustains said suitable vacuum, it being possible for the vacuum source to be the vacuum pump 12 itself.

Gastight passages make it possible to accommodate the service equipment required to enable the vacuum pump 12 to operate, e.g. the connections for supplying vacuum, electricity, water, compressed air, nitrogen, sensor information, etc.

The vacuum pump may be water-cooled, in conventional manner.

The present invention is not limited to the embodiments described explicitly. Rather it covers various variants and generalizations accessible to the person skilled in the art.

I claim:

1. A vacuum-generating device comprising at least one vacuum pump associated with a suction pipe and with a delivery pipe, wherein at least a portion of the vacuum-generating device is separated from the outside atmosphere by a volume in which a suitable vacuum prevails.

2. A device according to claim 1, wherein said volume in which a suitable vacuum prevails is gastight, thereby maintaining said suitable vacuum permanently.

3. A device according to claim 1, wherein said volume in which a suitable vacuum prevails is connected to an external vacuum source which sustains said suitable vacuum.

4. A device according to claim 1, wherein the external vacuum source is said vacuum pump.

5. A device according to claim 1, wherein said volume in which a suitable vacuum prevails occupies the space between the two walls of a gastight double wall.

6. A device according to claim 1, wherein said volume in which a suitable vacuum prevails occupies the space between a gastight outer wall and said portion of the vacuum-generating device.

7. A device according to claim 1, wherein said volume in which a suitable vacuum prevails is formed around the delivery pipe of the vacuum pump, so as to prevent the pumped gases from the condensing and solidifying, and so as to reduce the noise given off.

8. A device according to claim 7, wherein the delivery pipe is further providing with integral device for accoustically damping the pulsting pressure.

9. A device according to claim 1, wherein said volume in which a suitable vacuum prevails surrounds an intermediate or suction pipe element in the vacuum-generating device.

10. A device according to claim 1, wherein said volume in which a suitable vacuum prevails surrounds the vacuum pump, so as to limit the noise given off by the pump.

11. The vacuum generating device according to claim 1, wherein the at least a portion of the vacuum-generating device that is separated from the outside atmosphere by a volume in which a suitable vacuum prevails is at least a portion of the delivery pipe.

12. A vacuum generating device, comprising a delivery pipe for use with a vacuum pump, wherein at least a portion of the delivery pipe is separated from the outside atmosphere by a volume in which a suitable vacuum prevails.

* * * * *